(12) United States Patent
Daimon et al.

(10) Patent No.: US 11,211,914 B2
(45) Date of Patent: Dec. 28, 2021

(54) ACOUSTIC WAVE DEVICE (71) Applicant: Murata Manufacturing Co., Ltd., Nagaokakyo (JP)

(72) Inventors: Katsuya Daimon, Nagaokakyo (JP); Masato Araki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/022,354

(22) Filed: Sep. 16, 2020

(65) Prior Publication Data
US 2021/0006223 A1 Jan. 7, 2021

Related U.S. Application Data (63) Continuation of application No. PCT/JP2019/014503, filed on Apr. 1, 2019.

(30) Foreign Application Priority Data

Apr. 3, 2018 (JP) .............................. JP2018-071485

(51) Int. Cl.
H03H 9/02 (2006.01)
(52) U.S. Cl.
CPC ...... H03H 9/02622 (2013.01); H03H 9/0211 (2013.01); H03H 9/02015 (2013.01); H03H 9/02228 (2013.01); H03H 9/02992 (2013.01)
(58) Field of Classification Search
CPC ............. H03H 9/02015; H03H 9/0211; H03H 9/02228; H03H 9/02992; H03H 9/02574; H03H 9/02622

(Continued)

(56) References Cited

U.S. PATENT DOCUMENTS

2005/0200434 A1* 9/2005 Takano .............. H03H 9/02622
333/193
2013/0051588 A1 2/2013 Ruile et al.
(Continued)

FOREIGN PATENT DOCUMENTS

JP 2014-187568 A 10/2014
JP 2017-112603 A 6/2017
(Continued)

OTHER PUBLICATIONS

Official Communication issued in International Patent Application No. PCT/JP2019/014503, dated Jun. 18, 2019.

*Primary Examiner* — Robert J Pascal
*Assistant Examiner* — Jorge L Salazar, Jr.
(74) *Attorney, Agent, or Firm* — Keating & Bennett, LLP (57) ABSTRACT

An acoustic wave device includes a piezoelectric substrate in which a reverse-velocity surface is convex and an IDT electrode on the piezoelectric substrate. When an acoustic wave propagation direction is a first direction and a direction perpendicular or substantially perpendicular to the first direction is a second direction, the portion of the IDT electrode where first and second electrode fingers overlap in the first direction is a crossing region. The crossing region includes a center region centrally located in the second direction and a first and second edge regions located on two sides of the center region. Recesses 17 and 18 are respectively provided in portions of the piezoelectric substrate located in the first and second edge regions between the portions where the first and second electrode fingers are provided.

19 Claims, 8 Drawing Sheets

(58) Field of Classification Search
USPC .................................... 333/133, 193–196
See application file for complete search history.

(56) References Cited

U.S. PATENT DOCUMENTS

| | | |
|---|---|---|
| 2013/0285768 A1 | 10/2013 | Watanabe et al. |
| 2014/0285287 A1 | 9/2014 | Komatsu et al. |
| 2015/0280689 A1* | 10/2015 | Nakamura ......... H03H 9/02818 333/195 |
| 2016/0072475 A1 | 3/2016 | Mimura et al. |
| 2019/0097607 A1 | 3/2019 | Mimura |

FOREIGN PATENT DOCUMENTS

| | | |
|---|---|---|
| WO | 2011/088904 A1 | 7/2011 |
| WO | 2012/086639 A1 | 6/2012 |
| WO | 2014/192756 A1 | 12/2014 |
| WO | 2018/003282 A1 | 1/2018 |

* cited by examiner

ACOUSTIC WAVE DEVICE

CROSS REFERENCE TO RELATED APPLICATIONS

This application claims the benefit of priority to Japanese Patent Application No. 2018-071485 filed on Apr. 3, 2018 and is a Continuation Application of PCT Application No. PCT/JP2019/014503 filed on Apr. 1, 2019. The entire contents of each application are hereby incorporated herein by reference.

BACKGROUND OF THE INVENTION

1. Field of the Invention

The present invention relates to an acoustic wave device.

2. Description of the Related Art

Heretofore, acoustic wave devices have been widely used in filters of mobile phone devices and the like. International Publication No. 2011/088904 discloses an example of an acoustic wave device. The interdigital transducer (IDT) electrode of this acoustic wave device includes a central excitation region, inner edge regions that are adjacent to both sides of the central excitation region, and outer edge regions that are adjacent to the inner edge regions. The acoustic velocity is reduced in the inner edge regions by providing mass-adding films in the inner edge regions or by increasing the electrode finger width in the inner edge regions.

Transverse modes are suppressed in the acoustic wave device disclosed in International Publication No. 2011/088904 by making the acoustic velocities different in the individual regions. However, in recent years, with the demands for lower loss and lower spurious responses, it has not always been possible to sufficiently suppress transverse modes.

SUMMARY OF THE INVENTION

Preferred embodiments of the present invention provide acoustic wave devices that are each able to significantly reduce or prevent transverse modes.

An acoustic wave device according to a preferred embodiment of the present invention includes a piezoelectric substrate in which a reverse-velocity surface is convex and an IDT electrode provided on the piezoelectric substrate. The IDT electrode includes a first busbar and a second busbar that face each other, a plurality of first electrode fingers including first ends that are connected to the first busbar, and a plurality of second electrode fingers including first ends that are connected to the second busbar and that are interdigitated with the plurality of first electrode fingers. When an acoustic wave propagation direction is a first direction and a direction perpendicular or substantially perpendicular to the first direction is a second direction, a portion of the IDT electrode where the first electrode fingers and the second electrode fingers overlap in the first direction is a crossing region. The crossing region includes a center region that is centrally located in the second direction, a first edge region that is located at a side of the center region adjacent to or in a vicinity of the first busbar, and a second edge region that is located at a side of the center region adjacent to or in a vicinity of the second busbar. The IDT electrode includes a first gap region located between the first edge region and the first busbar and a second gap region located between the second edge region and the second busbar. Recesses are respectively provided in portions of the piezoelectric substrate located in the first edge region and the second edge region between portions where the plurality of first electrode fingers are provided and portions where the plurality of second electrode fingers are provided.

According to preferred embodiments of the present invention, acoustic wave devices are each able to be provided that significantly reduce or prevent transverse modes.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, the present invention will be made clearer by describing preferred embodiments of the present invention with reference to the drawings.

The preferred embodiments described in the present specification are examples and portions of the features shown in different preferred embodiments are able to be substituted for one another or combined with one another.

Figure 1:
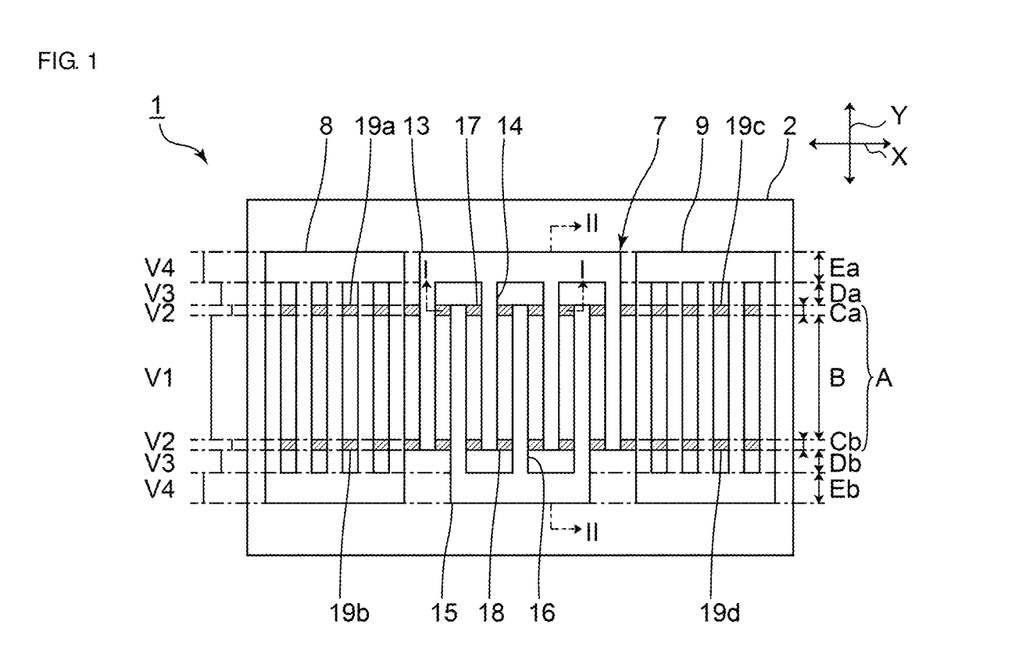
FIG. 1 is a plan view of an acoustic wave device according to a first preferred embodiment of the present invention.
Figure 2:
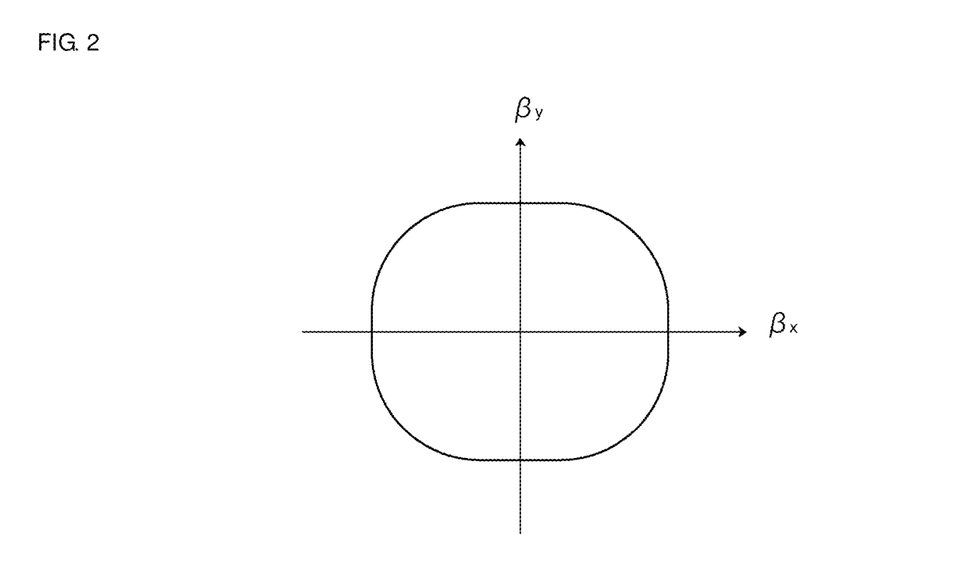
FIG. 2 is a diagram showing a reverse-velocity surface of a piezoelectric substrate in the first preferred embodiment of the present invention.
Figure 3:
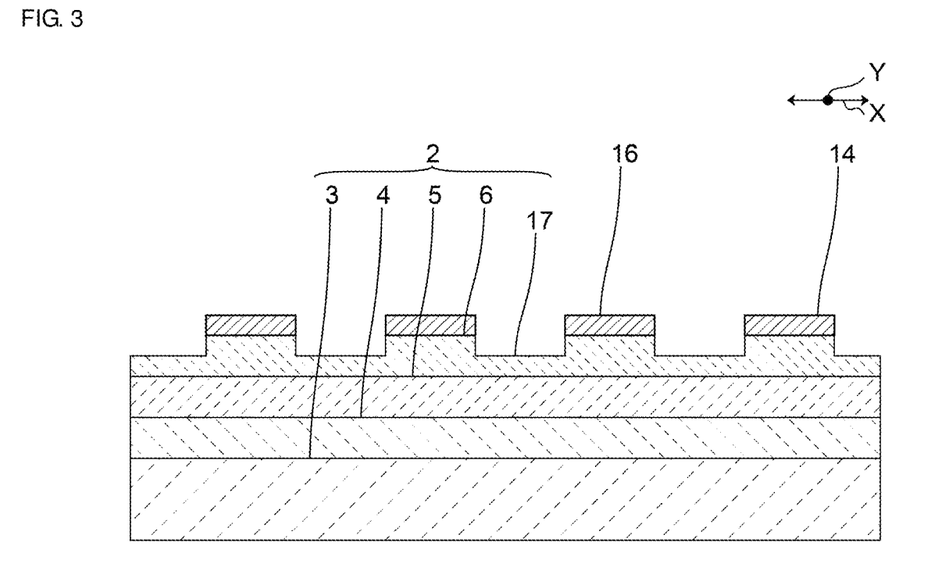
FIG. 3 is a sectional view taken along line I-I in FIG. 1.

FIG. 1 is a plan view of an acoustic wave device according to a first preferred embodiment of the present invention. FIG. 2 is a diagram showing a reverse-velocity surface of a piezoelectric substrate in the first preferred embodiment. FIG. 3 is a sectional view taken along line I-I in FIG. 1. Note that recesses, which will be described later, are shown by hatching in FIG. 1. Recesses are also shown by hatching in plan views in figures subsequent to FIG. 1.

As shown in FIG. 1, an acoustic wave device 1 includes a piezoelectric substrate 2. As shown in FIG. 2, a reverse-velocity surface of the piezoelectric substrate 2 is convex. As shown in FIG. 3, in the first preferred embodiment, the piezoelectric substrate 2 is a multilayer body in which a support substrate 3, a high-acoustic-velocity film 4, a low-acoustic-velocity film 5, and a piezoelectric layer 6 are stacked in this order. The piezoelectric layer 6 includes lithium tantalate (LiTaO$_3$) in the first preferred embodiment.

An IDT electrode 7 is provided on the piezoelectric layer 6 of the piezoelectric substrate 2. Acoustic waves are excited by applying an alternating-current voltage to the IDT electrode 7. A reflector 8 and a reflector 9 are located on the two sides of the IDT electrode 7 in an acoustic wave propagation direction. Thus, the acoustic wave device 1 according to the first preferred embodiment is an acoustic wave resonator.

Here, the support substrate 3 includes, for example, a piezoelectric material such as spinel, aluminum nitride, aluminum oxide, silicon carbide, silicon nitride, silicon oxynitride, a diamond like carbon (DLC) film, silicon (Si), sapphire, lithium tantalate, lithium niobate, or quartz, any of various ceramic materials such as glass, alumina, zirconia, cordierite, mullite, steatite, forsterite, diamond, or magnesia, a material mainly including of any of these materials, or a material mainly including of a mixture of any of these materials. The material of the support substrate 3 is not limited to these examples.

The high-acoustic-velocity film 4 is a high-acoustic-velocity layer in the first preferred embodiment. "High-acoustic-velocity layer" refers to a layer in which the acoustic velocity of a propagating bulk wave is higher than the acoustic velocity of an acoustic wave propagating along the piezoelectric layer 6. For example, aluminum nitride, aluminum oxide, silicon carbide, silicon nitride, silicon oxynitride, silicon, sapphire, lithium tantalate, lithium niobate, quartz, alumina, zirconia, cordierite, mullite, steatite, forsterite, magnesia, a DLC film, or diamond, a medium mainly including of any of these materials, or a medium mainly including of a mixture of any of these materials may be preferably used as the material of the high-acoustic-velocity film 4. In addition, it is sufficient that the material of the high-acoustic-velocity film 4 be a material having a relatively high acoustic velocity.

The low-acoustic-velocity film 5 is a film in which the acoustic velocity of a propagating bulk wave is lower than the acoustic velocity of an acoustic wave propagating along the piezoelectric layer 6. For example, a material mainly including a compound provided by adding fluorine, carbon, or boron to silicon oxide, glass, silicon oxynitride, tantalum oxide, or silicon oxide may preferably be used as the material of the low-acoustic-velocity film 5. It is sufficient that the material of the low-acoustic-velocity film 5 be a material having a relatively low acoustic velocity.

The IDT electrode 7, the reflector 8, and the reflector 9 may include a multilayer metal film in which a plurality of metal films are stacked or may include a single-layer metal film.

The acoustic wave device 1 according to the first preferred embodiment is able to effectively confine the energy of acoustic waves to the side of the piezoelectric layer 6 due to the piezoelectric substrate 2 in which the high-acoustic-velocity film 4, the low-acoustic-velocity film 5, and the piezoelectric layer 6 are stacked on top of one another. Here, in the first preferred embodiment, the piezoelectric layer 6 is indirectly provided on the high-acoustic-velocity film 4, which defines and functions as a high-acoustic-velocity layer, with the low-acoustic-velocity film 5 interposed between the high-acoustic-velocity film 4 and the piezoelectric layer 6. The piezoelectric layer 6 may instead be directly provided on the high-acoustic-velocity layer.

A protective film including a dielectric may be provided on the piezoelectric substrate 2 to cover the IDT electrode 7. Therefore, the IDT electrode 7 is less likely to be damaged.

Hereafter, the features of the IDT electrode 7 in the first preferred embodiment will be described.

As shown in FIG. 1, the IDT electrode 7 includes a first busbar 13 and a second busbar 15, which face each other. The IDT electrode 7 includes a plurality of first electrode fingers 14 including first ends that are connected to the first busbar 13. In addition, the IDT electrode 7 includes a plurality of second electrode fingers 16 including first ends that are connected to the second busbar 15. The plurality of first electrode fingers 14 and the plurality of second electrode fingers 16 are interdigitated with each other.

Here, the acoustic wave propagation direction is regarded as a first direction X and a direction perpendicular or substantially perpendicular to the first direction X is regarded as a second direction Y. The portion of the IDT electrode 7 where the first electrode fingers 14 and the second electrode fingers 16 overlap in the first direction X is a crossing region A. The crossing region A includes a center region B that is centrally located in the second direction Y and a first edge region Ca and a second edge region Cb that are located on the two sides of the center region B in the second direction Y. The first edge region Ca is located at the side of the center region B adjacent to or in a vicinity of the first busbar 13. The second edge region Cb is located at the side of the center region B adjacent to or in a vicinity of the second busbar 15.

As shown in FIGS. 1 and 3, recesses 17 are provided in portions of the piezoelectric substrate 2 between portions where the plurality of first electrode fingers 14 are provided and portions where the plurality of second electrode fingers 16 are provided in the first edge region Ca. Similarly, recesses 18 are respectively provided in portions of the piezoelectric substrate 2 between portions where the plurality of first electrode fingers are provided and portions where the plurality of second electrode fingers 16 are provided in the second edge region Cb. As a result, the acoustic velocity in the first edge region Ca and the second edge region Cb is lower than the acoustic velocity in the center region B. Here, when V1 is the acoustic velocity in the center region B and V2 is the acoustic velocity in the first edge region Ca and the second edge region Cb, V1>V2.

In the first preferred embodiment, recesses 19a and recesses 19b are provided in portions of the piezoelectric substrate 2 between the portions where the plurality of electrode fingers of the reflector 8 are provided. The recesses 19a are located along lines extending from the recesses 17 in the acoustic wave propagation direction. The recesses 19b are located along lines extending from the recesses 18 in the acoustic wave propagation direction. Similarly, recesses 19c and recesses 19d are provided in portions of the piezoelectric substrate 2 between the portions where the plurality of electrode fingers of the reflector 9 are provided. The recesses 19c are located along lines extending from the recesses 17 in the acoustic wave propagation direction. The recesses 19d are located along lines extending from the recesses 18 in the acoustic wave propagation direction. However, the recesses 19a, the recesses 19b, the recesses 19c, and the recesses 19d do not necessarily have to be provided in the portions of the piezoelectric substrate 2 between the portions where the electrode fingers of the reflector 8 and the reflector 9 are provided.

Note that the recesses 17, the recesses 18, the recesses 19a, the recesses 19b, the recesses 19c, and the recesses 19d are provided in the piezoelectric layer 6 of the piezoelectric substrate 2 and do not extend to the low-acoustic-velocity film 5.

The IDT electrode 7 includes a first gap region Da that is located between the first edge region Ca and the first busbar 13. The IDT electrode 7 includes a second gap region Db that is located between the second edge region Cb and the second busbar 15.

Of the first electrode fingers 14 and the second electrode fingers 16, only the first electrode fingers 14 are provided in the first gap region Da. Of the first electrode fingers 14 and the second electrode fingers 16, only the second electrode fingers 16 are provided in the second gap region Db. As a result, the acoustic velocity in the first gap region Da and the second gap region Db is higher than the acoustic velocity in the first edge region Ca and the second edge region Cb. Here, when the acoustic velocity in the first gap region Da and the second gap region Db is V3, V3>V2. In the first preferred embodiment, the acoustic velocity in the first gap region Da and the second gap region Db is lower than the acoustic velocity in the center region B, i.e., V1>V3.

Figure 4:
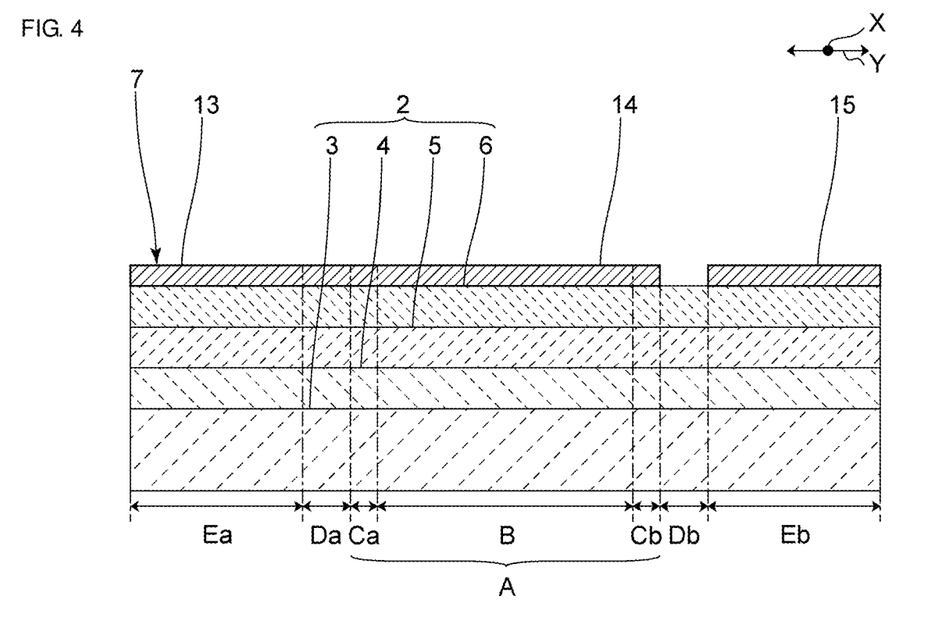
FIG. 4 is a sectional view taken along line II-II in FIG. 1.

FIG. 4 is a sectional view taken along line II-II in FIG. 1.

As shown in FIGS. 1 and 4, recesses are not provided in the first gap region Da and the second gap region Db in the first preferred embodiment. The recesses 17 and the recesses 18 are provided only in the first edge region Ca and the second edge region Cb. However, recesses may also be provided in the first gap region Da and the second gap region Db.

As shown in FIG. 1, the IDT electrode 7 includes a first busbar region Ea in which the first busbar 13 is provided and a second busbar region Eb in which the second busbar 15 is provided. In the acoustic wave device 1, the acoustic velocity in the first busbar region Ea and the second busbar region Eb is higher than the acoustic velocity in the center region B. Here, when the acoustic velocity in the first busbar region Ea and the second busbar region Eb is V4, V4>V1.

The relationship between these acoustic velocities in the acoustic wave device 1 is V4>V1>V3>V2.

In preferred embodiments of the present invention, the relationship between the acoustic velocities is not limited to this acoustic velocity relationship, but it is preferable that V1>V2 and V3>V2, for example. Thus, the acoustic wave device 1 utilizes a piston mode. This acoustic velocity relationship is shown in FIG. 1. In the portion of FIG. 1 that shows the relationship between the acoustic velocities, the further a line representing the magnitude of an acoustic velocity is toward the left side, the higher the acoustic velocity is. Similarly, in portions where an acoustic velocity relationship is shown in figures subsequent to FIG. 1, the further a line representing the magnitude of an acoustic velocity is toward the left side, the higher the acoustic velocity is.

In the first preferred embodiment, the reverse-velocity surface of the piezoelectric substrate 2 is convex and the recesses and the recesses 18 are provided in portions of the piezoelectric substrate 2 located in the first edge region Ca and the second edge region Cb. Accordingly, transverse modes are able to be significantly reduced or prevented. This will be explained by comparing the first preferred embodiment and a first comparative example and a second comparative example.

The first comparative example differs from the first preferred embodiment in that recesses are not provided in the piezoelectric substrate. The acoustic wave device of the first comparative example does not utilize a piston mode. The second comparative example differs from the first preferred embodiment in that recesses are not provided in the piezoelectric substrate and in that mass-adding films are provided on the plurality of first electrode fingers and the plurality of second electrode fingers in the first edge region and the second edge region. As a result of the mass-adding film being provided, the acoustic velocity is lower in the first edge region and the second edge region. The acoustic wave device of the second comparative example is an acoustic wave device of the related art that uses a piston mode.

Figure 5:
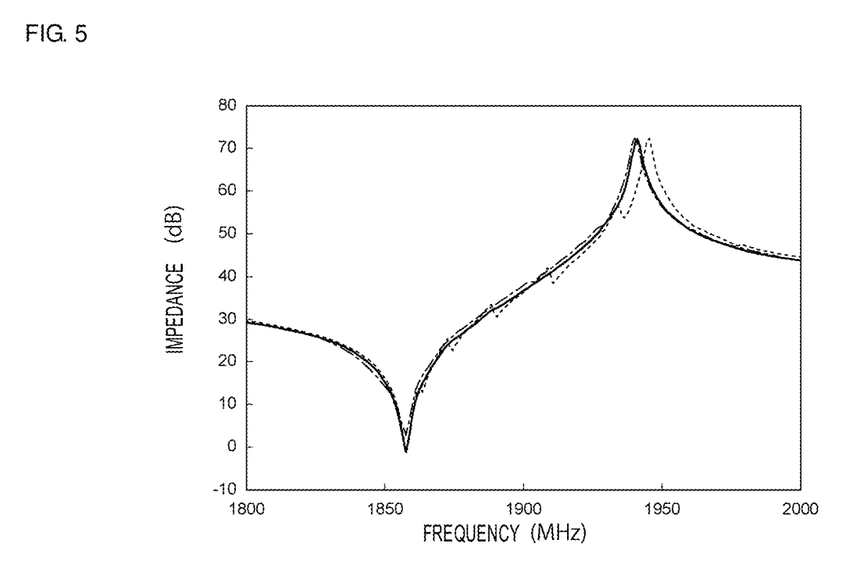
FIG. 5 is a diagram showing the impedance-frequency characteristics of acoustic wave devices of the first preferred embodiment of the present invention and a first comparative example and a second comparative example.
Figure 6:
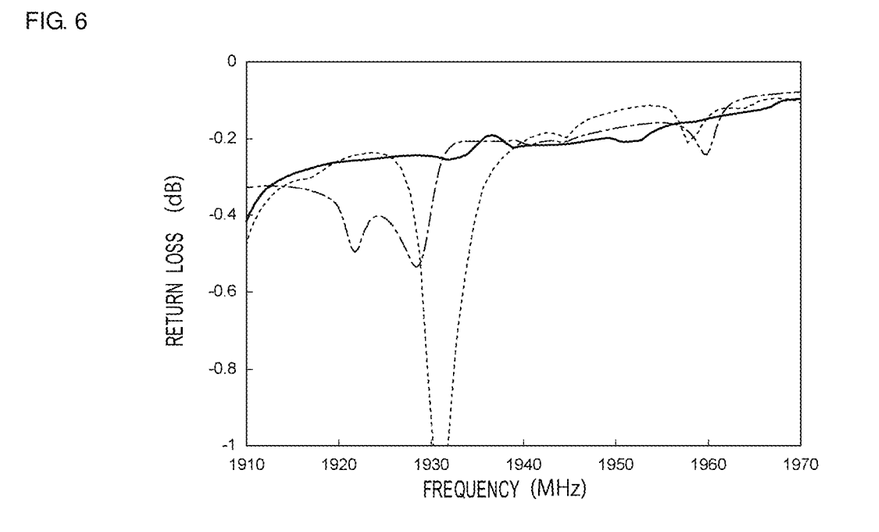
FIG. 6 is a diagram showing return loss in a vicinity of the resonant frequency in the acoustic wave devices of the first preferred embodiment of the present invention and the first comparative example and the second comparative example.
Figure 7:
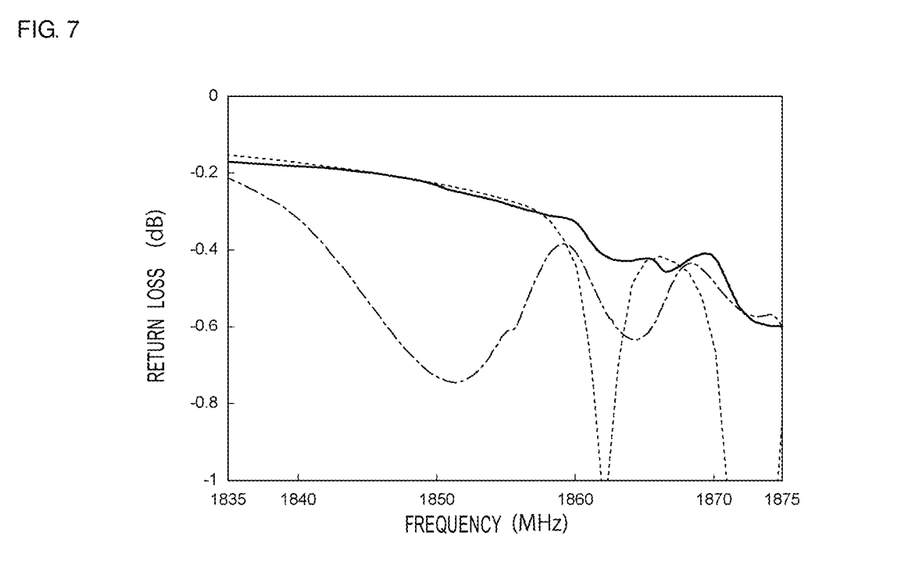
FIG. 7 is a diagram showing return loss in a vicinity of the anti-resonant frequency in the acoustic wave devices of the first preferred embodiment of the present invention and the first comparative example and the second comparative example.

FIG. 5 is a diagram showing the impedance-frequency characteristics of the acoustic wave devices of the first preferred embodiment, the first comparative example, and the second comparative example. FIG. 6 is a diagram showing return loss in a vicinity of the resonant frequency in the acoustic wave devices of the first preferred embodiment, the first comparative example, and the second comparative example. FIG. 7 is a diagram showing return loss in a vicinity of the anti-resonant frequency in the acoustic wave devices of the first preferred embodiment, the first comparative example, and the second comparative example. Solid lines in FIGS. 5 to 7 show results for the first preferred embodiment, dashed lines show results for the first comparative example, and short-dash long-dash lines show results for the second comparative example. The horizontal axis is also shown in FIGS. 5 to 7 with the resonant frequencies of the acoustic wave devices of the first preferred embodiment, the first comparative example, and the second comparative example being set to the same or substantially the same frequency.

As shown in FIG. 5, in the first comparative example, a plurality of large ripples are generated due to transverse modes between the resonant frequency and the anti-resonant frequency. In contrast, in the first preferred embodiment, ripples are not generated between the resonant frequency and the anti-resonant frequency and transverse modes are able to be significantly reduced or prevented.

Here, when a filter device includes an acoustic wave resonator, the acoustic wave resonator defines an attenuation pole at the resonant frequency or the anti-resonant frequency. Therefore, the return loss in a vicinity of the resonant frequency and the return loss in a vicinity of the anti-resonant frequency are particularly important. However, as shown in FIGS. 6 and 7, spurious due to transverse modes is generated in the first comparative example in a vicinity of the resonant frequency and in a vicinity of the anti-resonant frequency. In addition, it is clear that spurious due to transverse modes is not sufficiently reduced in the second comparative example as well.

In contrast, it is clear that spurious responses due to transverse modes in a vicinity of the resonant frequency and in a vicinity of the anti-resonant frequency are significantly reduced or prevented in the first preferred embodiment. Therefore, the effect of spurious responses on the characteristics of a filter device, for example, steepness, is able to be significantly reduced or prevented in the case where a filter device includes the acoustic wave device 1 of the first preferred embodiment. "Steepness" refers to the magnitude of a change in insertion loss that occurs with a change in frequency, for example, at the high-frequency end or low-frequency end of the passband.

In an acoustic wave device of the related art that uses a piston mode, the widths of the plurality of first electrode fingers and the plurality of second electrode fingers may be larger in the first edge region and the second edge region than in the other portions. Thus, the acoustic velocity may be lower in the first edge region and the second edge region. The widths of the first electrode fingers and the second electrode fingers are the dimensions of the first electrode fingers and the second electrode fingers in the first direction X. The distance between adjacent first electrode fingers and second electrode fingers is smaller in the first edge region and the second edge region of the acoustic wave device. In contrast, the widths of the first electrode fingers 14 and the second electrode fingers 16 are constant or substantially constant in the first preferred embodiment. Therefore, the distance between adjacent first electrode fingers and second electrode fingers 16 is able to be increased throughout the second direction Y. Therefore, the IDT electrode 7 is less likely to undergo electrostatic breakdown.

Alternatively, in the related art, a dielectric film may be provided on the piezoelectric substrate to cover the IDT electrode and mass-adding films may be provided on the dielectric film in the first edge region and the second edge region. Regarding this, in the first preferred embodiment, a piston mode is able to be used without providing mass-adding films made of a metal or dielectric. Therefore, transverse modes are able to be significantly reduced or prevented without incurring disadvantages, for example, the generation of electrostatic capacitances between the metal mass-adding films and the IDT electrode or the occurrence of peeling between the mass-adding films and the dielectric film.

Here, in the first preferred embodiment, the depths of the recesses 17 and the recesses 18 are small at less than about 100 nm, for example. Thus, productivity is able to be increased for the acoustic wave device 1 because the amount of grinding that is performed on the piezoelectric substrate 2 during manufacturing is able to be reduced.

Figure 8:
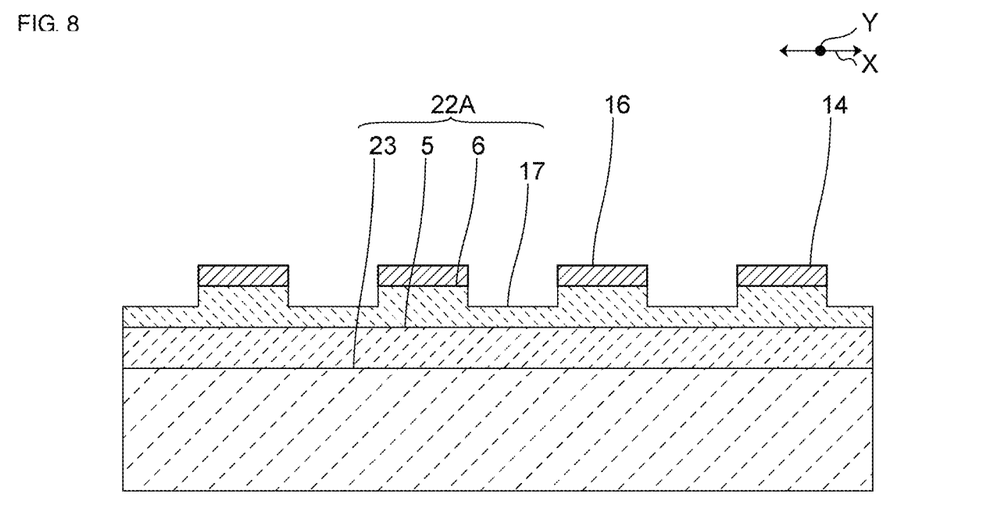
FIG. 8 is a sectional view of an acoustic wave device according to a first modification of the first preferred embodiment of the present invention.
Figure 9:
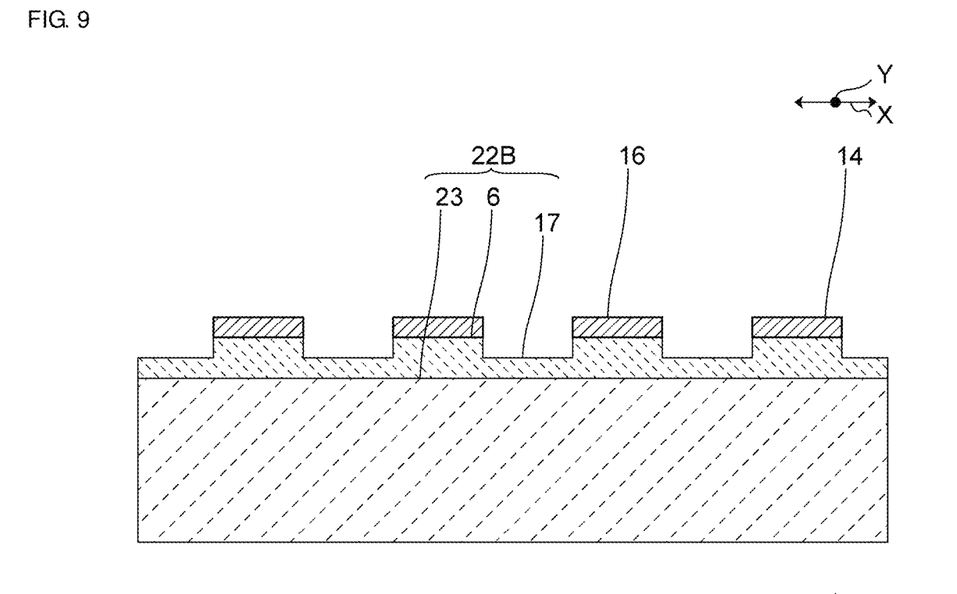
FIG. 9 is a sectional view of an acoustic wave device according to a second modification of the first preferred embodiment of the present invention.

Hereafter, first and second modifications of the first preferred embodiment that differ from the first preferred embodiment with respect to features of the piezoelectric substrate will be described. In the first and second modifications, transverse modes are able to be significantly reduced or prevented, similarly to as in the first preferred embodiment.

As shown in FIG. 8, in a piezoelectric substrate 22A of the first modification, the high-acoustic-velocity layer is a support substrate 23. In addition, the low-acoustic-velocity film is provided between the high-acoustic-velocity layer and the piezoelectric layer 6 similarly to as in the first preferred embodiment. For example, aluminum nitride, aluminum oxide, silicon carbide, silicon nitride, silicon oxynitride, silicon, sapphire, lithium tantalate, lithium niobate, quartz, alumina, zirconia, cordierite, mullite, steatite, forsterite, magnesia, a DLC film, diamond, a medium mainly including of any of these materials, or a medium mainly including of a mixture of any of these materials may preferably be used as the material of the support substrate 23 in this modification. It is sufficient that the material of the support substrate 23 defining and functioning as the high-acoustic-velocity layer is a material having a relatively high acoustic velocity.

As shown in FIG. 9, the second modification differs from the first modification in that a piezoelectric substrate 22B does not include a low-acoustic-velocity film. Thus, a low-acoustic-velocity film does not necessarily have to be provided. The high-acoustic-velocity layer may be a high-acoustic-velocity film like in the first preferred embodiment. Accordingly, the piezoelectric substrate is a multilayer body in which the high-acoustic-velocity film and the piezoelectric layer are stacked in this order.

Figure 10:
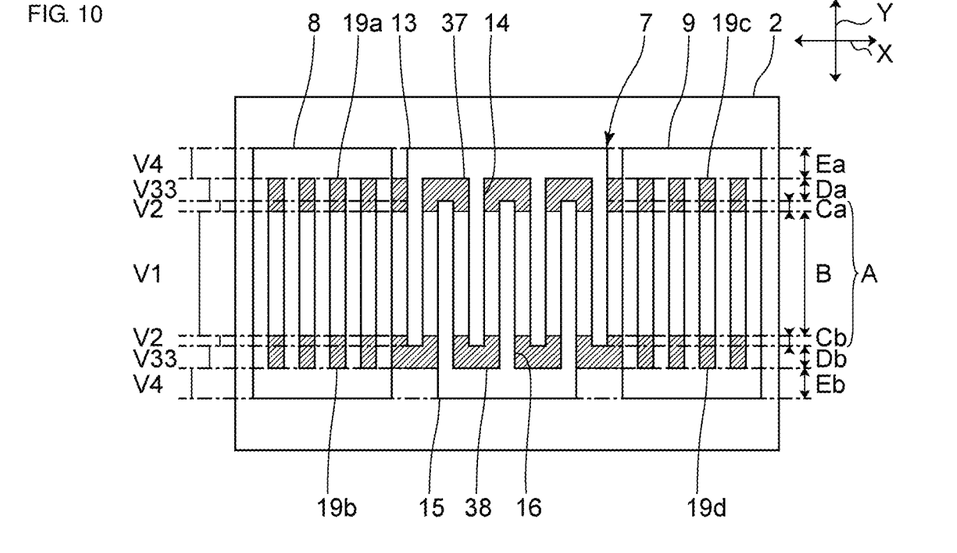
FIG. 10 is a plan view of an acoustic wave device according to a second preferred embodiment of the present invention.
Figure 11:
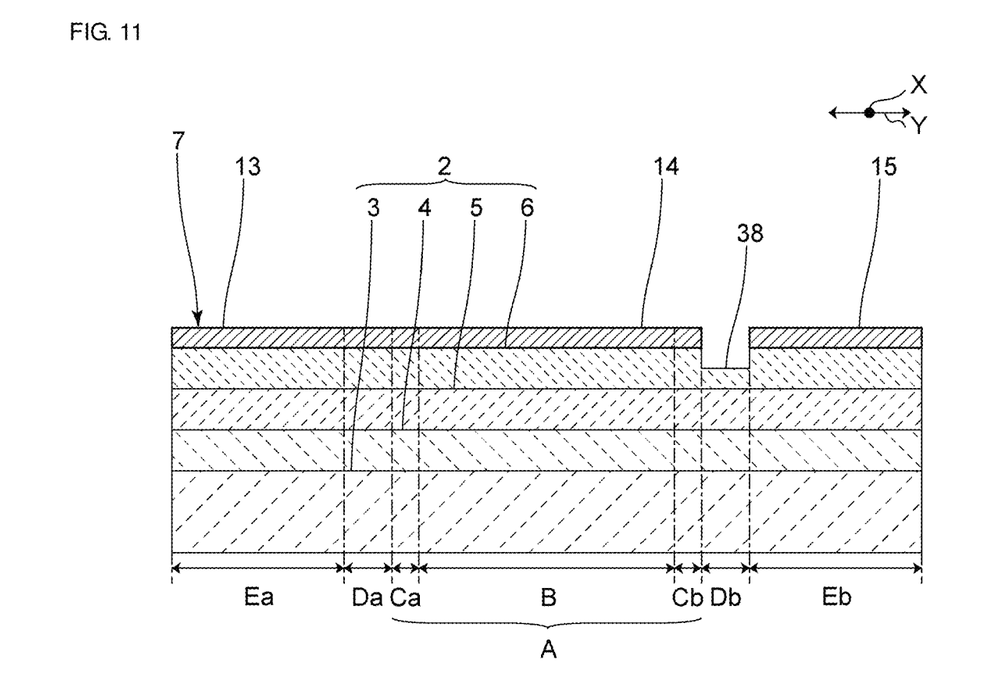
FIG. 11 is a sectional view of the acoustic wave device according to the second preferred embodiment of the present invention.

FIG. 10 is a plan view of an acoustic wave device according to a second preferred embodiment of the present invention. FIG. 11 is a sectional view of the acoustic wave device according to the second preferred embodiment. FIG. 11 shows a cross section equivalent to a cross section taken along line II-II in FIG. 1.

As shown in FIG. 10, the second preferred embodiment differs from the first preferred embodiment in that recesses 37 provided in the piezoelectric substrate 2 extend through the first edge region Ca and the first gap region Da. As shown in FIGS. 10 and 11, the second preferred embodiment differs from the first preferred embodiment in that recesses 38 provided in the piezoelectric substrate 2 extend through the second edge region Cb and the second gap region Db. In other respects, the acoustic wave device of the second preferred embodiment has the same or similar features as the acoustic wave device 1 of the first preferred embodiment.

More specifically, the recesses 37 provided in the piezoelectric substrate 2 extend through the entire first edge region Ca and through the entire first gap region Da. Similarly, the recesses 38 provided in the piezoelectric substrate 2 extend through the entire second edge region Cb and through the entire second gap region Db. As a result, the acoustic velocity in the first gap region Da and the second gap region Db is lower than the acoustic velocity in the center region B. On the other hand, the acoustic velocity in the first gap region Da and the second gap region Db is higher than the acoustic velocity in the first edge region Ca and the second edge region Cb. Here, when the acoustic velocity in the first gap region Da and the second gap region Db is V33, V4>V1>V33>V2.

In the second preferred embodiment, spurious responses due to transverse modes are able to be significantly reduced or prevented similarly to as in the first preferred embodiment. However, the recesses 17 are preferably provided only in the first edge region Ca and the recesses 18 are preferably provided only in the second edge region Cb in the piezoelectric substrate 2, for example, as in the first preferred embodiment shown in FIG. 1. Accordingly, spurious responses due to transverse modes are able to be further significantly reduced or prevented.

The recesses 37 shown in FIG. 10 may extend through the first edge region Ca and through a portion of the first gap region Da. The recesses 38 may extend through the second edge region Cb and through a portion of the second gap region Db. In other words, recesses provided in the piezoelectric substrate in the first edge region may extend through portions of the piezoelectric substrate between the portions where the plurality of first electrode fingers are provided in the first gap region and recesses provided in the piezoelectric substrate in the second edge region may extend through portions of the piezoelectric substrate between the portions where the plurality of second electrode fingers are provided in the second gap region. Accordingly, transverse modes are able to be significantly reduced or prevented.

Figure 12:
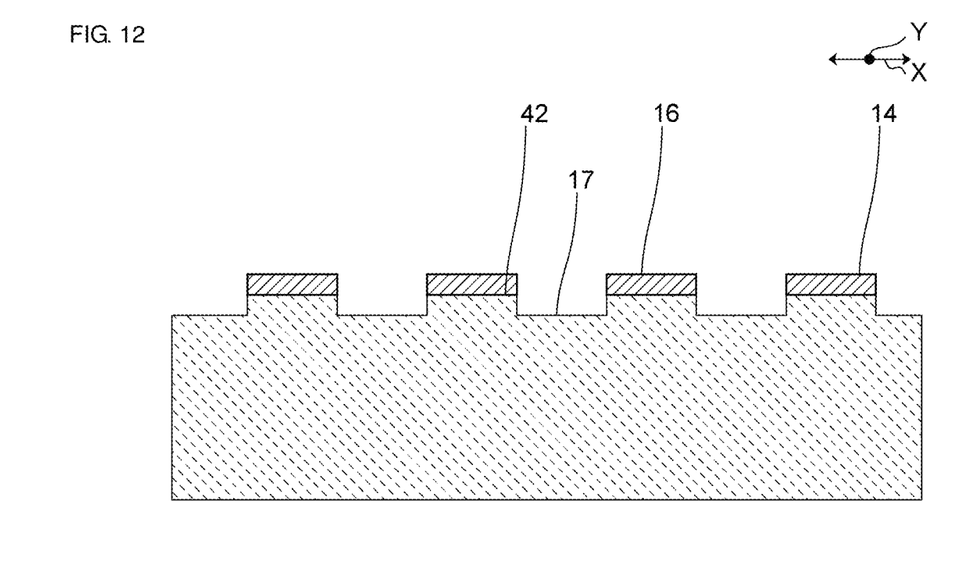
FIG. 12 is a sectional view of an acoustic wave device according to a third preferred embodiment of the present invention.

FIG. 12 is a sectional view of an acoustic wave device according to a third preferred embodiment of the present invention. FIG. 12 shows a cross section equivalent to a cross section taken along line I-I in FIG. 1.

As shown in FIG. 12, a piezoelectric substrate 42 of the third preferred embodiment is a piezoelectric substrate. The piezoelectric substrate 42 is preferably made of lithium niobate (LiNbO$_3$), for example. Similarly to the first preferred embodiment, the reverse-velocity surface of the piezoelectric substrate 42 is convex. In the third preferred embodiment, the reverse-velocity surface is elliptical or substantially elliptical. More specifically, $k_x^2 + (1+\Gamma) \times k_y^2 = k_0^2$ and $\Gamma > -1$. Here, $k_x$ is the longitudinal component of the wavenumber vector, $k_y$ is the transverse component of the wavenumber vector, and $k_0$ is the wavenumber vector in the main propagation direction.

Figure 13:
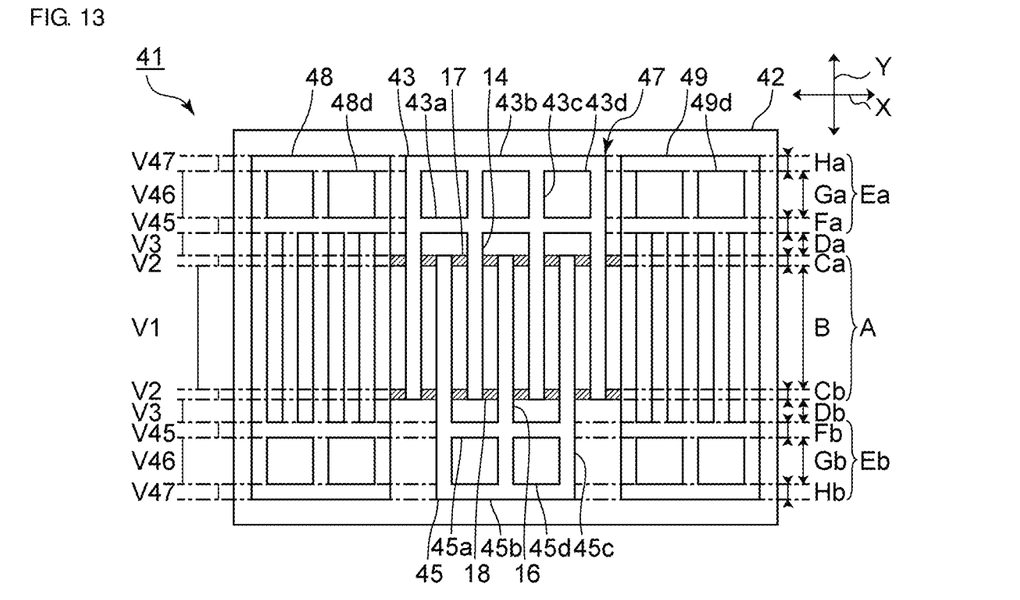
FIG. 13 is a plan view of the acoustic wave device according to the third preferred embodiment of the present invention.

FIG. 13 is a plan view of the acoustic wave device according to the third preferred embodiment.

As shown in FIG. 13, a first busbar 43 of an IDT electrode 47 of an acoustic wave device 41 includes a plurality of openings 43d. The plurality of openings 43d are located along the first direction X. More specifically, the first busbar 43 has an inner busbar portion 43a and an outer busbar portion 43b that face each other with the plurality of openings 43d provided between the inner busbar portion 43a and the outer busbar portion 43b. The inner busbar portion 43a and the outer busbar portion 43b extend in the first direction X. First ends of the plurality of first electrode fingers 14 are connected to the inner busbar portion 43a. In addition, the first busbar 43 has a plurality of connection portions 43c that connect the inner busbar portion 43a and the outer busbar portion 43b to each other. Each opening 43d is surrounded by the inner busbar portion 43a, the outer busbar portion 43b, and two connection portions 43c. In the third preferred embodiment, the connection portions 43c are positioned along lines extending from the first electrode fingers 14. However, the positions of the connection portions 43c are not limited to this example.

The first busbar region Ea in the third preferred embodiment includes a first inner busbar region Fa in which the inner busbar portion 43a is provided, a first opening region Ga in which the plurality of openings 43d are provided, and a first outer busbar region Ha in which the outer busbar portion 43b is provided.

A second busbar 45 is similar to the first busbar 43. More specifically, the second busbar 45 includes a plurality of openings 45d. The plurality of openings 45d are located along the first direction X. The second busbar 45 has a plurality of connection portions 45c that connect an inner busbar portion 45a and an outer busbar portion 45b to each other. The second busbar region Eb includes a second inner busbar region Fb in which the inner busbar portion 45a is provided, a second opening region Gb in which the plurality of openings 45d are provided, and a second outer busbar region Hb in which the outer busbar portion 45b is provided.

Similarly to the first preferred embodiment, recesses 17 are provided in the first edge region Ca and recesses 18 are provided in the second edge region Cb in the piezoelectric substrate 42. As a result, the acoustic velocity in the first edge region Ca and the second edge region Cb is lower than the acoustic velocity in the center region B. On the other hand, the piezoelectric substrate 42 in the third preferred embodiment does not have a multilayer structure like in the first preferred embodiment. As a result, the acoustic velocity in the first gap region Da and the second gap region Db is higher than the acoustic velocity in the center region. Therefore, the relationship between these acoustic velocities is V3>V1>V2.

In the third preferred embodiment, the acoustic velocity in the first inner busbar region Fa, the second inner busbar region Fb, the first outer busbar region Ha, and the second outer busbar region Hb are lower than the acoustic velocity in the center region B. When V45 is the acoustic velocity in the first inner busbar region Fa and the second inner busbar region Fb and V47 is the acoustic velocity in the first outer busbar region Ha and the second outer busbar region Hb, V1>V45=V47. On the other hand, the acoustic velocity in the first opening region Ga and the second opening region Gb is higher than the acoustic velocity in the center region B. Here, when V46 is the acoustic velocity in the first forming region Ga and the second opening region Gb, V46>V1.

The relationships between the acoustic velocities in the acoustic wave device 41 are V3>V1>V2 and V46>V1>V45=V47.

In the third preferred embodiment, the acoustic velocity in the first edge region Ca and the second edge region Cb is low due to the recesses 17 and the recesses 18, similarly to as in the first preferred embodiment. In addition, the IDT electrode 47 includes the first opening region Ga and the second opening region Gb, which are regions where the acoustic velocity is high, outside the first gap region Da and the second gap region Db in the second direction Y. Therefore, transverse modes are able to be significantly reduced or prevented.

Note that the IDT electrode 47 in the third preferred embodiment may be provided on the piezoelectric substrate 2, the piezoelectric substrate 22A, or the piezoelectric substrate 22B in the first preferred embodiment or the first or second modification of the first preferred embodiment. In these cases as well, transverse modes are able to be significantly reduced or prevented.

In the present preferred embodiment, a reflector 48 includes a plurality of openings 48d and a reflector 49 includes a plurality of openings 49d similarly to the IDT electrode 47. However, the reflector 48 and the reflector 49 do not necessarily have to include the openings 48d and the openings 49d similarly to as in the first preferred embodiment.

Recesses are not provided in the portions of the piezoelectric substrate 42 of the acoustic wave device 41 between the portions where the plurality of electrode fingers of the reflector 48 and the reflector 49 are provided. In addition, recesses corresponding to the recesses 19a, the recesses 19b, the recesses 19c, and the recesses 19d shown in FIG. 1 may be provided similarly to as in the first preferred embodiment.

Figure 14:
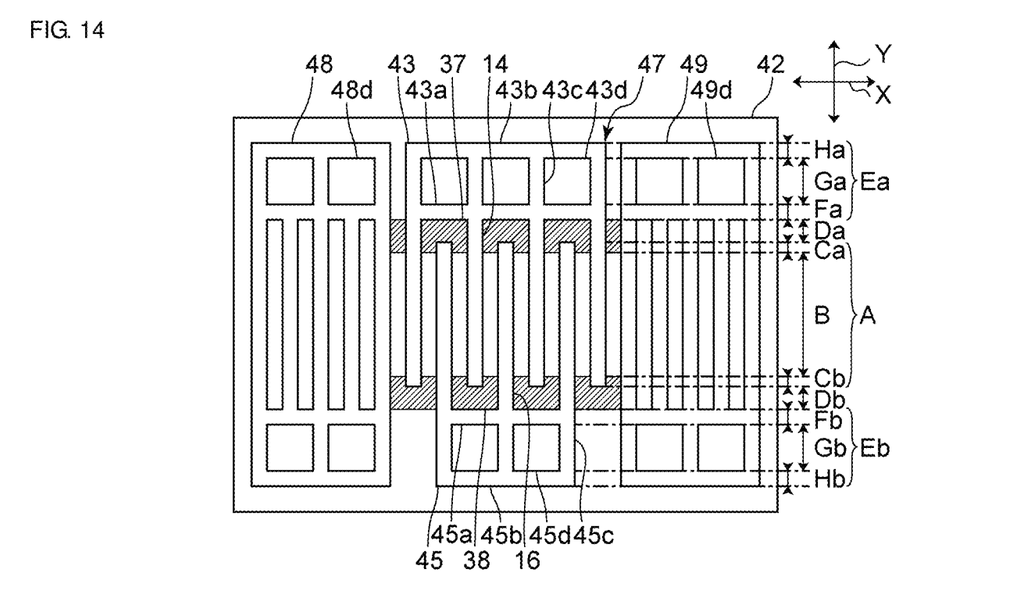
FIG. 14 is a plan view of an acoustic wave device according to a fourth preferred embodiment of the present invention.

FIG. 14 is a plan view of an acoustic wave device according to a fourth preferred embodiment of the present invention.

The fourth preferred embodiment differs from the third preferred embodiment in that the recesses 37 and the recesses 38 are provided, similarly to as in the second preferred embodiment. In other respects, the acoustic wave device of the fourth preferred embodiment has the same or similar features as the acoustic wave device 41 of the third preferred embodiment.

More specifically, the recesses 37 provided in the piezoelectric substrate 42 extend through the entire first edge region Ca and through the entire first gap region Da. The recesses 38 provided in the piezoelectric substrate 42 extend through the entire second edge region Cb and through the entire second gap region Db. The recesses 37 may instead extend through a portion of the first gap region Da. The recesses 38 may instead extend through a portion of the second gap region Db. Alternatively, the recesses 37 may extend through a portion of the inner busbar portion 43a or the openings 43d. The recesses 38 may extend through a portion of the inner busbar portion 45a or the openings 45d.

In the fourth preferred embodiment, transverse modes are able to be significantly reduced or prevented similarly to as in the third preferred embodiment.

Figure 15:
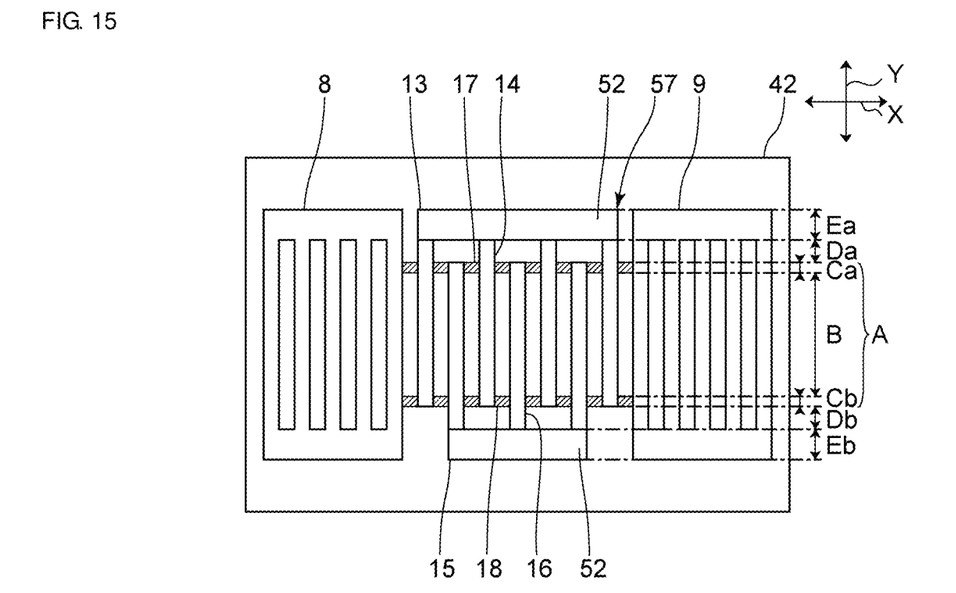
FIG. 15 is a plan view of an acoustic wave device according to a fifth preferred embodiment of the present invention.
Figure 16:
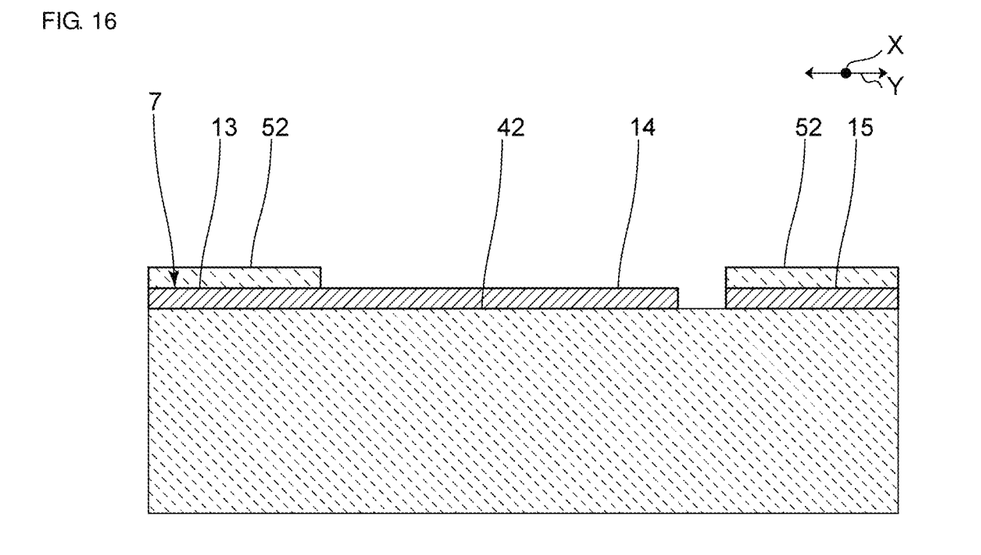
FIG. 16 is a sectional view of the acoustic wave device according to the fifth preferred embodiment of the present invention.

FIG. 15 is a plan view of an acoustic wave device according to a fifth preferred embodiment of the present invention. FIG. 16 is a sectional view of the acoustic wave device according to the fifth preferred embodiment. FIG. 16 shows a cross section equivalent to a cross section taken along line II-II in FIG. 1.

As shown in FIG. 15, the fifth preferred embodiment differs from the third preferred embodiment in that a first busbar 13 and a second busbar 15 of an IDT electrode 57 do not include openings and in that acoustic-velocity-increasing layers 52 are provided on the first busbar 13 and the second busbar 15. The fifth preferred embodiment also differs from the third preferred embodiment in that the reflector 8 and the reflector 9 do not include openings. The acoustic-velocity-increasing layers 52 are films that increase the acoustic velocity in the first busbar region Ea and the second busbar region Eb. In other respects, the acoustic wave device of the fifth preferred embodiment has the same or similar features as the acoustic wave device 41 of the third preferred embodiment.

The acoustic-velocity-increasing layers 52 do not extend beyond the regions above the first busbar 13 and the second busbar 15. The acoustic-velocity-increasing layers 52 are made of, for example, a dielectric material such as alumina, aluminum nitride, or silicon nitride. As shown in FIGS. 15 and 16, the acoustic velocity is high in the first busbar region Ea and the second busbar region Eb as a result of the acoustic-velocity-increasing layers 52 being provided on the first busbar 13 and the second busbar 15. As a result, similarly to as in the third preferred embodiment, transverse modes are able to be significantly reduced or prevented.

The acoustic-velocity-increasing layers 52 of the fifth preferred embodiment may be provided on the first busbar 13 and the second busbar 15 in the first preferred embodiment or the first or second modification of the first preferred embodiment. In these cases as well, transverse modes are able to be significantly reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a piezoelectric substrate including a reverse-velocity surface that is convex; and
an interdigital transducer (IDT) electrode provided on the piezoelectric substrate; wherein
the IDT electrode includes a first busbar and a second busbar that face each other, a plurality of first electrode fingers having first ends that are connected to the first busbar, and a plurality of second electrode fingers having first ends that are connected to the second busbar and that are interdigitated with the plurality of first electrode fingers;
when an acoustic wave propagation direction is a first direction and a direction perpendicular or substantially perpendicular to the first direction is a second direction, a portion of the IDT electrode where the plurality of first electrode fingers and the plurality of second electrode fingers overlap in the first direction is a crossing region;
the crossing region includes of a center region that is centrally located in the second direction, a first edge region that is located at a side of the center region adjacent to or in a vicinity of the first busbar, and a second edge region that is located at a side of the center region adjacent to or in a vicinity of the second busbar;
the IDT electrode includes a first gap region located between the first edge region and the first busbar and a second gap region located between the second edge region and the second busbar; and
recesses are respectively provided in portions of the piezoelectric substrate located in the first edge region and the second edge region between portions where the plurality of first electrode fingers are provided and portions where the plurality of second electrode fingers are provided.

2. The acoustic wave device according to claim 1, wherein
an acoustic velocity in the first edge region and the second edge region is lower than an acoustic velocity in the center region;
an acoustic velocity in the first gap region is higher than an acoustic velocity in the first edge region; and
an acoustic velocity in the second gap region is higher than an acoustic velocity in the second edge region.

3. The acoustic wave device according to claim 1, wherein
the recesses provided in the piezoelectric substrate in the first edge region extend through portions of the first gap region located between the portions of the piezoelectric substrate where the plurality of first electrode fingers are provided; and
the recesses provided in the piezoelectric substrate in the second edge region extend through portions of the second gap region located between the portions of the piezoelectric substrate where the plurality of second electrode fingers are provided.

4. The acoustic wave device according to claim 1, wherein
the first busbar and the second busbar each include a plurality of openings; and
the plurality of openings are located along the first direction in the first busbar and the second busbar.

5. The acoustic wave device according to claim 4, wherein the piezoelectric substrate is made of lithium niobate.

6. The acoustic wave device according to claim 1, wherein
the IDT electrode includes a first busbar region in which the first busbar is located and a second busbar region in which the second busbar is located; and
acoustic-velocity-increasing layers, which increase an acoustic velocity in the first busbar region and the second busbar region, are provided on the first busbar and the second busbar.

7. The acoustic wave device according to claim 6, wherein the acoustic-velocity-increasing layers are made of alumina, aluminum nitride, or silicon nitride.

8. The acoustic wave device according to claim 6, wherein an acoustic velocity in the first busbar region and the second busbar region is higher than an acoustic velocity in the center region.

9. The acoustic wave device according to claim 1, wherein
the piezoelectric substrate includes a high-acoustic-velocity layer and a piezoelectric layer that is directly or indirectly provided on the high-acoustic-velocity layer;
an acoustic velocity of bulk waves propagating along the high-acoustic-velocity layer is higher than an acoustic velocity of acoustic waves propagating along the piezoelectric layer; and
the piezoelectric layer is made of lithium tantalate.

10. The acoustic wave device according to claim 9, wherein
a low-acoustic-velocity film is provided between the high-acoustic-velocity layer and the piezoelectric layer; and
an acoustic velocity of bulk waves propagating along the low-acoustic-velocity film is lower than an acoustic velocity of bulk waves propagating along the piezoelectric layer.

11. The acoustic wave device according to claim 10, wherein the recesses do not extend to the low-acoustic-velocity film.

12. The acoustic wave device according to claim 9, wherein the high-acoustic-velocity layer is a support substrate.

13. The acoustic wave device according to claim 9, further comprising:
a support substrate; wherein
the high-acoustic-velocity layer is a high-acoustic-velocity film provided between the support substrate and the piezoelectric layer.

14. The acoustic wave device according to claim 1, wherein the piezoelectric substrate is made of lithium tantalate.

15. The acoustic wave device according to claim 1, further comprising:
a first reflector; and
a second reflector; wherein
in the first direction, the IDT electrode is provided between the first reflector and the second reflector.

16. The acoustic wave device according to claim 1, wherein a protective film including a dielectric material is provided on the piezoelectric substrate to cover the IDT electrode.

17. The acoustic wave device according to claim 1, wherein
only the plurality of first electrode fingers are provided in the first gap region; and
only the plurality of second electrode fingers are provided in the second gap region.

18. The acoustic wave device according to claim 1, wherein a depth of each of the recesses is less than about 100 nm.

19. The acoustic wave device according to claim 1, wherein the reverse-velocity surface is elliptical or substantially elliptical.

* * * * *